United States Patent
Blair

(10) Patent No.: US 8,624,349 B1
(45) Date of Patent: Jan. 7, 2014

(54) SIMULTANEOUS ISOLATION TRENCH AND HANDLE WAFER CONTACT FORMATION

(75) Inventor: Christopher S Blair, Lake Oswego, OR (US)

(73) Assignee: Maxim Integrated Products, Inc., San Jose, CA (US)

( * ) Notice: Subject to any disclaimer, the term of this patent is extended or adjusted under 35 U.S.C. 154(b) by 247 days.

(21) Appl. No.: 12/901,924

(22) Filed: Oct. 11, 2010

(51) Int. Cl.
  *H01L 21/70* (2006.01)
(52) U.S. Cl.
  USPC ........... 257/506; 257/501; 257/508; 257/510; 257/513
(58) Field of Classification Search
  USPC .................... 257/501, 506, 508, 510, 513
  See application file for complete search history.

(56) References Cited

U.S. PATENT DOCUMENTS

| | | | | |
|---|---|---|---|---|
| 5,479,048 | A * | 12/1995 | Yallup et al. | 257/621 |
| 5,856,700 | A * | 1/1999 | Woodbury | 257/518 |
| 5,895,953 | A * | 4/1999 | Beasom | 257/751 |
| 6,071,803 | A * | 6/2000 | Rutten et al. | 438/618 |
| 6,291,875 | B1 * | 9/2001 | Clark et al. | 257/622 |
| 6,433,401 | B1 * | 8/2002 | Clark et al. | 257/524 |
| 6,521,947 | B1 * | 2/2003 | Ajmera et al. | 257/347 |
| 6,649,964 | B2 | 11/2003 | Kim | |
| 2001/0045614 | A1 * | 11/2001 | Begley et al. | 257/520 |
| 2002/0090763 | A1 * | 7/2002 | Tseng | 438/149 |
| 2002/0117728 | A1 * | 8/2002 | Brosnihan et al. | 257/446 |
| 2002/0146867 | A1 * | 10/2002 | Salvatore | 438/149 |
| 2003/0089948 | A1 * | 5/2003 | Min | 257/347 |
| 2003/0137009 | A1 * | 7/2003 | Leonardi | 257/355 |
| 2004/0163476 | A1 * | 8/2004 | Partridge et al. | 73/754 |
| 2004/0217421 | A1 | 11/2004 | Aminpur et al. | |
| 2004/0241917 | A1 | 12/2004 | Schwan et al. | |
| 2006/0030110 | A1 * | 2/2006 | Kumura et al. | 438/296 |
| 2007/0048888 | A1 * | 3/2007 | Christenson | 438/48 |
| 2008/0283960 | A1 * | 11/2008 | Lerner | 257/508 |
| 2010/0181640 | A1 * | 7/2010 | Shiromoto et al. | 257/506 |
| 2013/0134490 | A1 * | 5/2013 | Nummy et al. | 257/301 |

* cited by examiner

*Primary Examiner* — Fernando L Toledo
*Assistant Examiner* — Mohammed Shamsuzzaman
(74) *Attorney, Agent, or Firm* — Advent, LLP

(57) ABSTRACT

Techniques are described to simultaneously form an isolation trench and a handle wafer contact without additional mask steps. In one or more implementations, an isolation trench and a handle wafer contact trench are simultaneously formed in a substrate. The substrate includes an insulating layer that defines a trench bottom of the handle wafer contact trench. A handle wafer is bonded to a bottom surface of the substrate. An oxide insulating layer is deposited in the isolation trench and the handle wafer contact trench. The oxide insulating layer is then etched so that the oxide insulating layer covering the trench bottom is at least partially removed. The trench bottom is then etched so that a top surface of the handle wafer is at least partially exposed. The handle wafer contact trench may then be at least partially filled with an electrical conductive material.

9 Claims, 5 Drawing Sheets

SIMULTANEOUS ISOLATION TRENCH AND HANDLE WAFER CONTACT FORMATION

BACKGROUND

Semiconductor device process technology nodes often employ isolation techniques to prevent current leakage between adjacent semiconductor devices and reduce parasitic capacitance. Two of these techniques include trench isolation and silicon-on-insulator (SOI) technology.

Trench isolation provides lateral isolation of two different types of transistors. For example, trench isolation may be used to separate an n-channel transistor's p-well structure from a p-channel transistor's n-well structure. Isolation trenches are created by etching a pattern of trenches in the silicon and then depositing one or more dielectric materials (e.g., silicon dioxide), which acts as an electric insulator, to fill the trenches.

SOI technology reduces parasitic capacitance due to isolation from the bulk silicon and provides resistance to latchup due to complete isolation of the n- and p-well structures. One typical SOI fabrication process includes growing a thick layer of dielectric material (e.g., silicon dioxide) on a handle wafer. A second wafer is then bonded on top of the grown dielectric material of the handle wafer. The second wafer is then placed through a grinding and polishing process to achieve semiconductor grade material that may be utilized to form semiconductor devices.

SUMMARY

Techniques are described to simultaneously form an isolation trench and a handle wafer contact trench without additional mask steps. In one or more implementations, an isolation trench and a handle wafer contact trench are simultaneously formed in a substrate. The substrate includes an insulating layer that defines a trench bottom of the handle wafer contact trench. A handle wafer is bonded to a bottom surface of the substrate. An oxide insulating layer is deposited in the isolation trench and the handle wafer contact trench. The oxide insulating layer is then etched so that the oxide insulating layer covering the trench bottom is at least partially removed. The insulating layer defining the trench bottom is then etched so that a top surface of the handle wafer is at least partially exposed. The handle wafer contact trench may then be at least partially filled with an electrical conductive material.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying figures. The use of the same reference numbers in different instances in the description and the figures may indicate similar or identical items.

DETAILED DESCRIPTION

Overview

Semiconductor technologies may include a SOI substrate to isolate devices, reduce capacitance, and sustain high voltages. These semiconductor technologies employ substrates that include one or more trenches to provide lateral isolation to semiconductor devices and a buried oxide layer to provide subsurface isolation to semiconductor devices. A handle wafer may be utilized in the fabrication process to assist in the creation of the buried oxide layer. The handle wafer may also be utilized to hold semiconductor devices in fixed positions with respect to each other.

High voltage characteristics may be modulated by handle wafer potential, and lower voltage devices may benefit from a handle wafer contact under electrostatic discharge (ESD) stress. However, the handle wafer may not be contacted from the topside without additional processing steps.

Therefore, techniques are described to simultaneously form an isolation trench and a handle wafer contact trench in a semiconductor device. The techniques described herein do not require any additional masking steps. In an implementation, the semiconductor device includes one or more active silicon regions formed within a substrate of the semiconductor device. The isolation trench and the handle wafer contact trench are simultaneously formed within the substrate. When filled with an oxide insulating material, the isolation trench furnishes lateral isolation to the one or more active silicon regions. The handle wafer contact trench provides a conduit between the top surface of the substrate and the handle wafer, which is bonded to the bottom surface of the substrate.

In the following discussion, an example semiconductor device is first described. Exemplary procedures are then described that may be employed to fabricate the example semiconductor device.

Example Implementations

Figure 1:
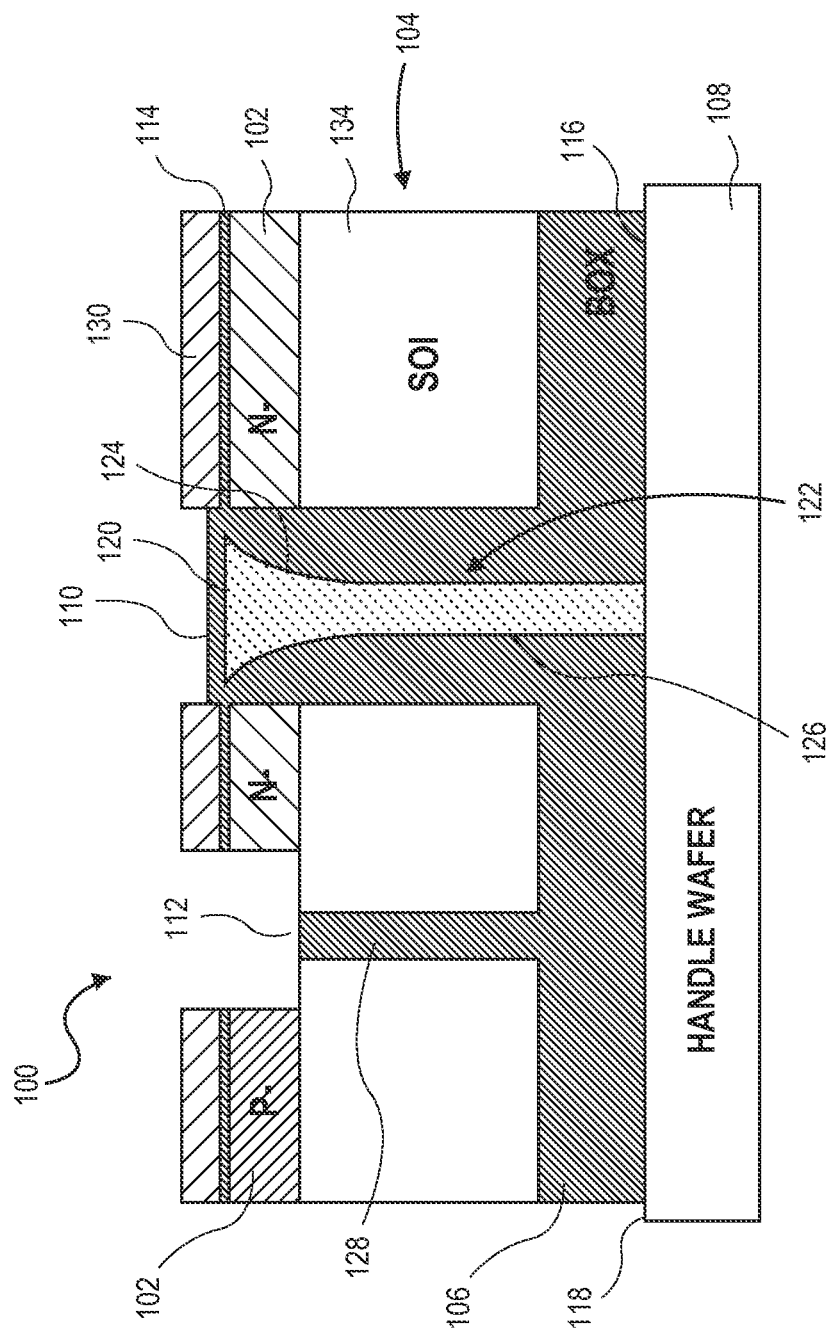
FIG. 1 is a diagrammatic partial cross-sectional side view illustrating a semiconductor device having a handle wafer contact trench and an isolation trench in accordance with an example implementation of the present disclosure.

FIG. 1 illustrates a cross-sectional view of a semiconductor device 100 in accordance with an example implementation of the present disclosure. As shown, the semiconductor device 100 includes one or more active silicon regions 102 formed in a substrate 104 and an insulating layer 106 disposed on a portion of a handle wafer 108 and in the substrate 104. The semiconductor device 100 also includes a handle wafer contact trench 110 and an isolation trench 112 formed in the substrate 104 of the semiconductor device 100.

The active silicon regions 102 are utilized to create integrated circuit device technology (e.g., complimentary metal-oxide-semiconductor (CMOS) technology, microelectromechanical systems (MEMS) technology, etc.). The active silicon regions 102 may be configured in a variety of ways. In an implementation, the active silicon regions 102 are capable of providing charge carriers to the substrate 104. For example, an active silicon region 102 may be comprised of an n-type diffusion region that is capable of providing extra conduction electrons as charge carriers. In another example, an active silicon region 102 may be comprised of a p-type diffusion region that is capable of providing extra holes as charge carriers. In another example, an active silicon region 102 may comprise an n-type well. In yet another example, an active silicon region 102 may comprise a p-type well. The one or more active silicon regions 102 are formed proximate to a top surface 114 of the substrate 104.

The substrate 104 comprises a base material utilized to form one or more electronic devices through various fabrication techniques such as photolithography, ion implantation, deposition, etching, and so forth. The substrate 104 may be configured in a variety of ways. In an implementation, the substrate 104 may be at least partially comprised of a silicon wafer. The substrate 104 may comprise an n-type silicon wafer or a p-type silicon wafer. For example, the substrate 104 may comprise a group V element (e.g., phosphorus, arsenic, antimony, etc.) to furnish n-type charge carrier elements to the silicon wafer. In another example, the substrate 104 may comprise a group IIIA element (e.g., boron, etc.) to furnish p-type charge carrier elements to the silicon wafer.

The insulating layer 106 furnishes isolation to the one or more active silicon regions 102. In one or more implementations, the insulating layer 106 is comprised of a buried insulating layer 106. For example, the insulating layer 106 forms a buried oxide (BOX) layer below the one or more active silicon regions 102. A portion of the insulating layer 106 may be formed by bonding a bottom surface 116 of the substrate 104 (i.e., surface opposite the top surface 114) to a top surface 118 of the handle wafer 108 to form a silicon-in-insulator (SOI) structure. The insulating layer 106 may comprise a layer of a suitable insulating material such as silicon dioxide ($SiO_2$).

The handle wafer 108 furnishes support to the insulating layer 106. The handle wafer 108 may be configured in a variety of ways. For example, in some implementations, the handle wafer 108 comprises a silicon wafer that may be doped with n- or p-type material. The handle wafer 108 may also serve to hold the one or more active silicon regions 102 in fixed positions with respect to each other.

The handle wafer contact trench 110 furnishes a conduit for furnishing an electrical contact such as an electrical conductive material 120 (e.g., doped polysilicon material, metal material, etc.) from the top surface 114 of the substrate 104 to the handle wafer 108. As shown, the handle wafer contact trench 110 includes at least one sidewall 122 that comprises a tapered portion 124 and an untapered portion 126 caused by the sidewall shape. The tapered portion 124 and the untapered portion 126 may have a "wine glass" cross-section as illustrated in FIG. 1 (e.g., when viewed in cross-section, the tapered portion 124 forms a bowl of the "wine glass," and the untapered portion 126 forms a stem of a "wine glass"). In an example implementation, the handle wafer contact trench 110 may have a width of approximately two point five (2.5) microns. In a specific implementation, as shown in FIG. 1, the electrical conductive material 120 is covered by an insulating layer 128 during the fabrication process.

The isolation trench 112 includes an oxide insulating material 128 (e.g., Silicon Dioxide ($SiO_2$)) to furnish lateral isolation to the one or more active silicon regions 102. The isolation trench 112 serves to prevent electrical current leakage between adjacent silicon active regions 102. The isolation trench 112 is simultaneously formed with the handle wafer contact trench 110. In example implementations, the isolation trench 112 may have a width of approximately 0.6 to approximately 0.8 microns.

Figure 3:
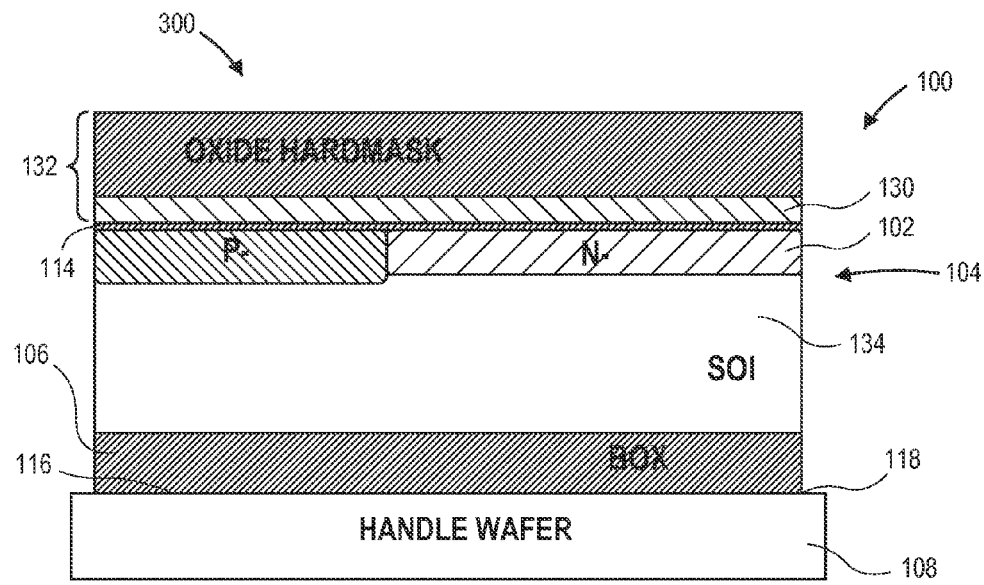
FIG. 3 is a diagrammatic partial cross-sectional side view illustrating a wafer-level semiconductor device during fabrication in accordance with the present disclosure, where the semiconductor device includes a dual oxide-nitride layer hardmask, active silicon regions, a handle wafer, and an insulating layer.
Figure 4:
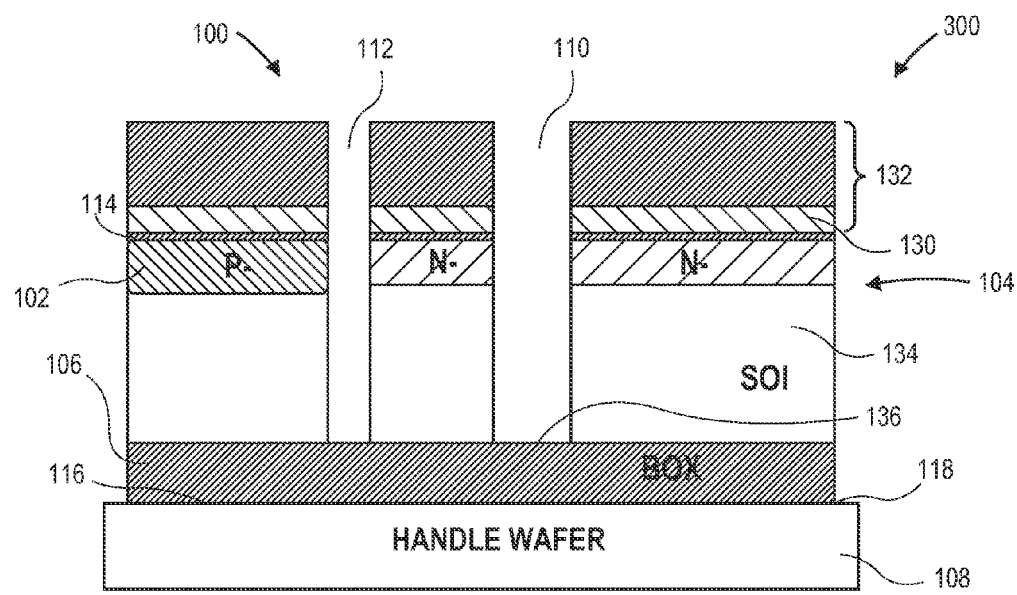
FIG. 4 is a diagrammatic partial cross-sectional side view illustrating a wafer-level semiconductor device during fabrication in accordance with the present disclosure, where the handle wafer contact trench and isolation trench have been formed through an etching procedure.

As illustrated in FIG. 1, the semiconductor device 100 also includes a nitride layer 130. The nitride layer 130 may be configured in a variety of ways. The nitride layer 130 serves as an etch stop. For example, the nitride layer 130 may implemented as part of a dual oxide-nitride hardmask 132 (as depicted in FIGS. 3 and 4) to prevent etching of the active silicon regions 102. In another implementation, the nitride layer 130 is utilized for shallow trench isolation operations.

Example Fabrication Processes

The following discussion describes example techniques for fabricating a semiconductor device having a handle wafer contact trench and an isolation trench such as the semiconductor device 100 shown in FIG. 1.

Figure 2:
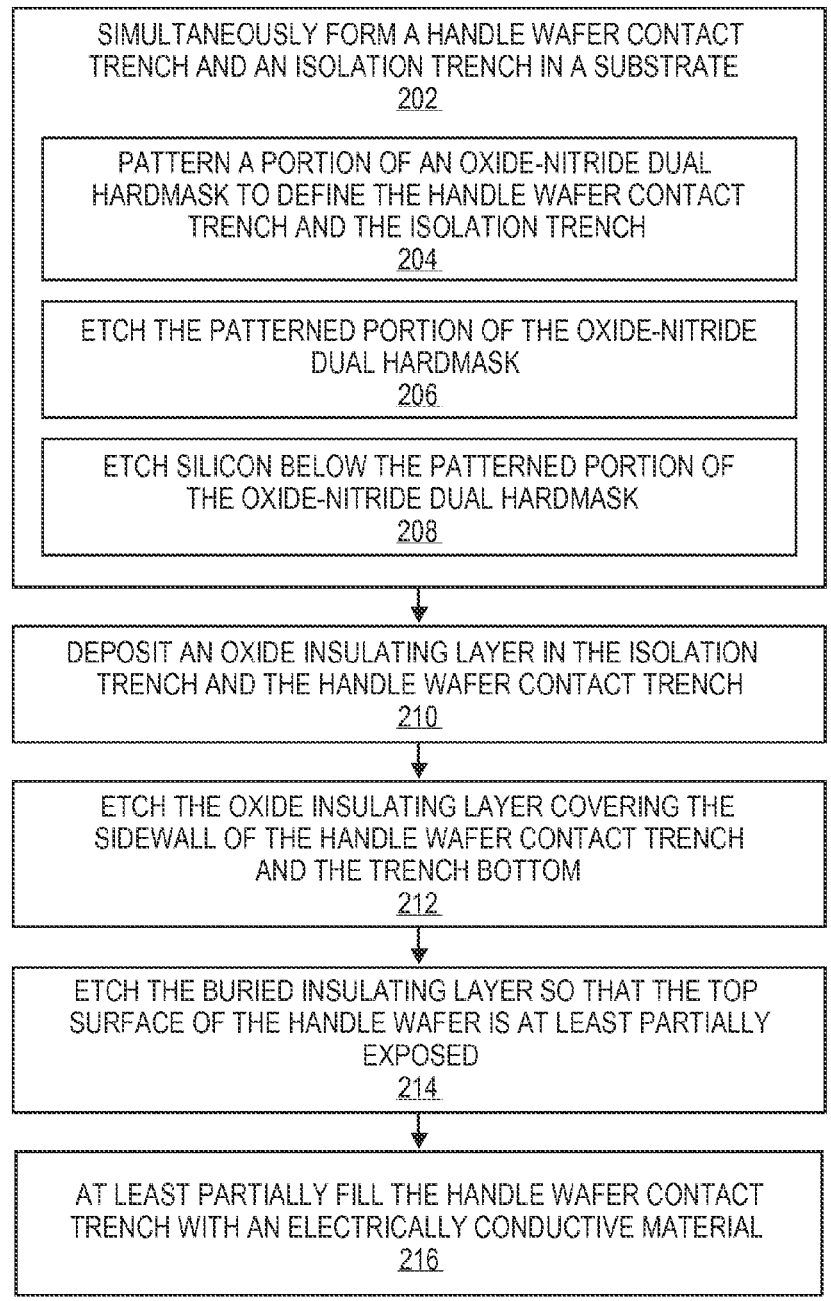
FIG. 2 is a flow diagram illustrating a process in an example implementation for fabricating the semiconductor devices having simultaneously formed handle wafer contact trenches and isolation trenches.

FIG. 2 depicts an example process 200 for simultaneously forming a handle wafer contact trench 110 and an isolation trench 112 in a substrate 104 of the semiconductor device 100 shown in FIG. 1. A portion of a semiconductor wafer 300 that comprises the substrate 104 is illustrated in FIGS. 3 through 7. In the process 200 illustrated, a handle wafer contact trench 110 and an isolation trench 112 are simultaneously formed in the substrate 104 (Block 202). The handle wafer contact trench 110 and the isolation trench 112 may be formed from deep trench isolation techniques through various etching steps. As illustrated in FIG. 3, the substrate 104 includes an insulated layer 106 (e.g., a BOX layer), one or more active silicon regions 102, a nitride layer 130, which may be utilized to form a dual oxide-nitride layer hardmask 132. A portion of dual oxide-nitride hardmask 132 is patterned to define the handle wafer contact trench 110 and the isolation trench 112. (Block 204). The patterned portion of the dual oxide-nitride layer hardmask 132 is then etched (Block 206), and the silicon below the patterned portion of the dual oxide-nitride layer hardmask 132 etched to form the handle wafer contact trench 110 and the isolation trench 112 (Block 208). For example, as illustrated in FIG. 4, a portion of the active silicon region(s) 102 and the silicon 134 below the active silicon region(s) 102 is etched to the insulating layer 106 to simultaneously form the handle wafer contact trench 110 and the isolation trench 112. The width of the handle wafer contact trench 110 is approximately three (3) times larger than the width of the isolation trench 112.

Figure 5:
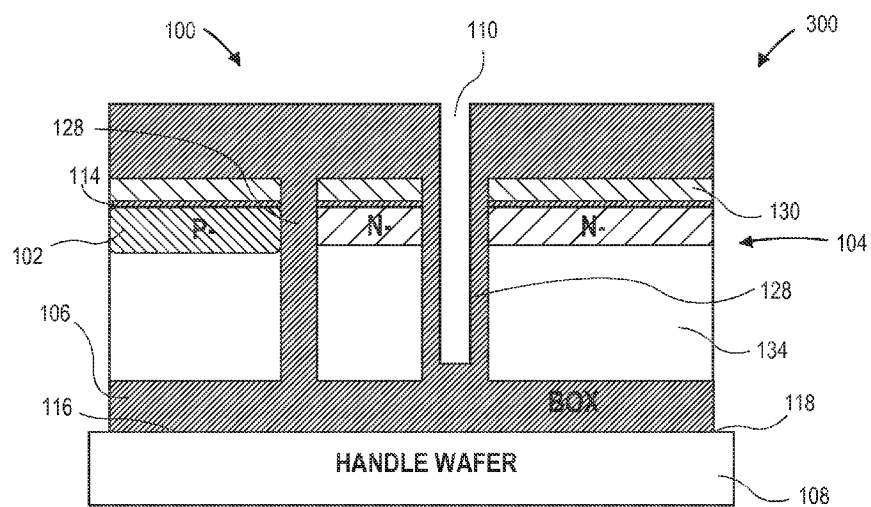
FIG. 5 is a diagrammatic partial cross-sectional side view illustrating a wafer-level semiconductor device during fabrication in accordance with the present disclosure, where an oxide insulating material is deposited in the handle wafer contact trench and the isolation trench.

An oxide insulating layer 128 is deposited in the handle wafer contact trench 110 and the insulating layer 112 (Block 210). As illustrated in FIG. 5, the oxide insulating layer 128 comprises a thin oxide liner layer grown in both trenches 110, 112 along with a thick low-pressure chemical vapor deposition (LPCVD) oxide layer on top of the thin oxide layer. In implementations, the thin oxide layer may have a thickness that ranges from approximately two hundred (200) angstroms to approximately eight hundred (800) angstroms. In one example, the thin oxide layer may have a thickness of approximately five hundred (500) angstroms. The LPCVD oxide layer may comprise tetraethyl orthosilicate, or the like. As illustrated in FIG. 5, the oxide insulating layer 128 substantially fills the isolation trench 112. The deposition of the oxide insulating layer 128 covers the sidewall 122 of the handle wafer contact trench 110 and a trench bottom 136 of the handle wafer contact trench 110.

Figure 6:
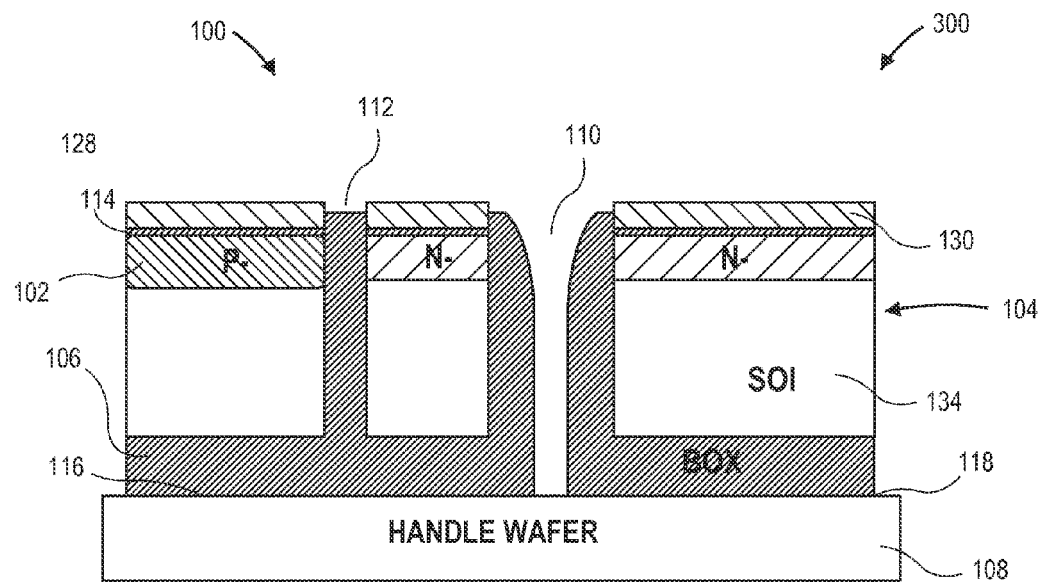
FIG. 6 is a diagrammatic partial cross-sectional side view illustrating a wafer-level semiconductor device during fabrication in accordance with the present disclosure, where the oxide insulating material is etched from the handle wafer contact trench and the isolation trench.

The oxide insulating layer 128 that covers the sidewall 122 of the handle wafer contact trench 110 and the trench bottom 136 of the handle wafer contact trench 110 is next etched so that the oxide insulating layer 128 is at least partially removed (Block 212) to expose the trench bottom 136. The trench bottom 136 is then etched so that the top surface 118 of the handle wafer 108 is at least partially exposed (Block 214). FIG. 6 illustrates a semiconductor device 100 where the oxide insulating layer 128 and trench bottom 136 have been removed to expose the top surface 118 of the handle wafer 108 is at least partially exposed. In one or more implementations, the etching steps (Blocks 212, 214) may be implemented using a plasma etch that stops on nitride to preserve the one or more active silicon regions 102 and cause the handle wafer contact trench 110 to have a "wine glass" shaped cross-section as illustrated in FIG. 1.

Figure 7:
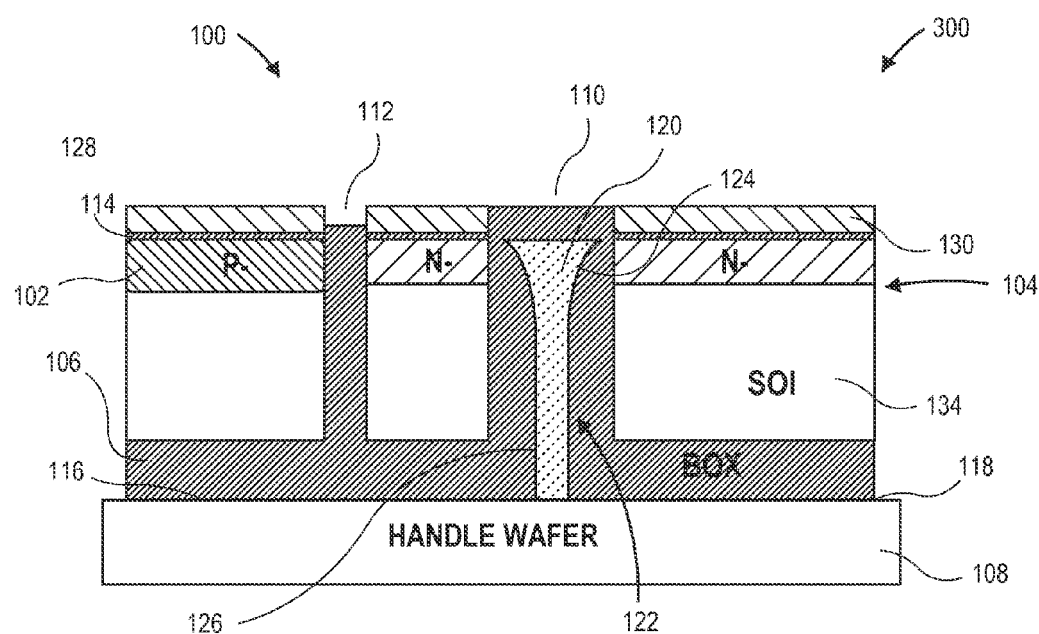
FIG. 7 is a diagrammatic partial cross-sectional side view illustrating a wafer-level semiconductor device during fabrication in accordance with the present disclosure, where the handle wafer contact trench is at least partially filled with an electrically conductive material.

The handle wafer contact trench 110 is then at least partially filled with an electrically conductive material 120 (Block 216) that furnishes a conduit between the top surface 114 of the substrate 104 and the handle wafer 108. FIG. 7 illustrates the handle wafer contact trench 110 as including an electrically conductive material 120. In an implementation, the electrically conductive material 120 may comprise a doped poly silicon material, a metal material, or the like.

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. A process comprising:
   simultaneously forming an isolation trench and a handle wafer contact trench in a silicon-on-insulator semiconductor substrate, the substrate including a buried insulating layer and a handle wafer bonded to a bottom surface of the substrate, the isolation trench having a first width and the handle wafer contact trench having a second width, the second width being greater than the first width and the buried insulating layer defining a trench bottom of the handle wafer contact trench, the isolation trench extending through a silicon-on-insulator layer, the silicon-on-insulator layer disposed directly on a buried oxide layer;
   depositing an oxide insulating layer in the isolation trench and the handle wafer contact trench, the oxide insulating layer covering a sidewall of the handle wafer contact trench and the trench bottom of the handle wafer contact trench, the oxide insulating layer at least substantially filling the isolation trench;
   etching the oxide insulating layer covering the sidewall of the handle wafer contact trench such that the sidewall shape defines a tapered portion and an untapered portion and the trench bottom of the handle wafer contact trench so that the oxide insulating layer covering the trench bottom is at least partially removed, the tapered portion having a continuously curved profile, the handle wafer contact trench having the tapered portion and the untapered portion caused by the sidewall shape;
   etching the buried insulating layer so that a top surface of the portion of the handle wafer is at least partially exposed;
   at least partially filling the handle wafer contact trench with an electrically conductive material; and
   covering a top of the electrically conductive material with an insulating material,
   wherein simultaneously forming the isolation trench and the handle wafer contact trench causes formation of at least three active silicon regions, wherein a first active silicon region of the at least three active silicon regions comprises a first dopant type and a second active silicon region and a third silicon region of the at least three active silicon regions comprise a second dopant type, the first dopant type different from the second dopant type.

2. The process as recited in claim 1, wherein simultaneously forming an isolation trench and a handle wafer contact trench in a substrate further comprises:
   patterning a portion of an oxide hardmask to define an isolation trench pattern and a handle wafer contact trench pattern;
   etching the patterned portion of the oxide hardmask; and
   etching silicon below the patterned portion of the oxide hardmask to form the isolation trench and the handle wafer contact trench.

3. The process as recited in claim 1, wherein simultaneously forming an isolation trench and a handle wafer contact trench in a substrate comprises simultaneously forming an isolation trench and a handle wafer contact trench in a substrate, the isolation trench having a first width of approximately 0.6 to approximately 0.8 microns.

4. The process as recited in claim 1, wherein simultaneously forming an isolation trench and a handle wafer contact trench in a substrate comprises simultaneously forming an isolation trench and a handle wafer contact trench in a substrate, the handle wafer contact trench having a second width of approximately 2.5 microns.

5. The process as recited in claim 1, wherein the second width is approximately three times larger than the first width.

6. The process as recited in claim 1, wherein at least partially filling the handle wafer contact trench with an electrically conductive material comprises at least partially filling the handle wafer contact trench with a polysilicon material.

7. The process as recited in claim 1, wherein the buried insulating layer comprises a buried oxide layer.

8. The process as recited in claim 1, wherein the first dopant type comprises a P-dopant type and the second dopant type comprises an N-dopant type.

9. The process as recited in claim 1, wherein the first active silicon region is adjacent to an isolation trench, the second active silicon region is disposed between the isolation trench and the handle wafer contact trench, and the third active silicon region is adjacent to the handle wafer contact trench.

* * * * *